Jan. 26, 1971 R. A. CHANDOS 3,559,098

WIDE FREQUENCY RANGE VOLTAGE CONTROLLED TRANSISTOR RELAXATION OSCILLATOR

Filed Oct. 10, 1968

INVENTOR
RICHARD A. CHANDOS
BY
Don Finkelstein
ATTORNEY

United States Patent Office 3,559,098

Patented Jan. 26, 1971

3,559,098

WIDE FREQUENCY RANGE VOLTAGE CONTROLLED TRANSISTOR RELAXATION OSCILLATOR

Richard A. Chandos, Goleta, Calif., assignor to Electro-Optical Industries, Inc., a corporation of California Filed Oct. 10, 1968, Ser. No. 766,561
Int. Cl. H03k *3/26*
U.S. Cl. 331—111 11 Claims

ABSTRACT OF THE DISCLOSURE

A voltage controlled oscillator providing output pulses controllable in frequency over a wide range from a few hundredths of a hertz to megahertz with a high degree of accuracy and stability. The oscillator employs a transistor constant current source for charging an adjustable R-C timing circuit which triggers a feedback controlled switching transistor circuit. The switching transistor circuit activates a separate transistor discharge circuit which also serves for isolating the triggering input from the switching transistor during switching to allow rapid reset of the timing circuit and to improve the output waveform.

REFERENCE TO RELATED APPLICATIONS

One particular application of the oscillator of this invention is as the timing signal generator of the digital filter disclosed in application Ser. No. 590,821, filed Oct. 31, 1966, now issued as U.S. Pat. No. 3,519,926, and assigned to the same assignee.

BACKGROUND OF THE INVENTION

Voltage controlled oscillators have long been used to produce timing signals in electronics communications and signal analyzing systems. Perhaps the most common oscillators are free running transistor multivibrators with control voltages applied symmetrically to two switching transistors. Another type of oscillator normally employing one active element is the unijunction transistor oscillator as described in: "Functional Circuits and Oscillators," by H. J. Reich, 1961, Van Nostrand, pp. 218–220. This simple circuit, when used in combination with a constant current source and a storage device, can constitute a relatively accurate timing device. When the unijunction transistor is connected in the well known Schmitt trigger circuit configuration as described in: "Transistor Circuit Design," 1961, McGraw-Hill Book Co., New York, pp. 381–383, the sharp, low hysteresis, output pulse desirable for timing circuits may be obtained.

SUMMARY OF THE INVENTION

I have discovered that an extremely broad frequency, for example 0.001 hertz to several megahertz range, voltage controlled oscillator may be produced using a minimum of precision components. Moreover, the output signal is a substantially rectangular pulse of extremely short rise and fall times, a virtual square wave, at any operating frequency.

This is accomplished by employing a constant current generator stage powered by a stabilized power supply and a storage capacitor circuit. The storage capacitor is connected to the base-emitter circuit of a high speed switching transistor rather than the conventional unijunction transistor and furnishes the required switching voltage after a precise charging delay. The delay is determined by a resistance network and Zener diode regulated supply.

The switching transistor is connected with an active feedback network operative to isolate the switching transistor from its input and increase its conduction characteristics during the switching cycle.

One feature of this invention resides in the combination of a constant current generator circuit, a storage circuit and a threshold switching circuit for producing precisely timed electrical pulses.

Another feature of the invention relates to the above combination including circuit means responding to operation of the threshold switching circuit for isolating the switching circuit from the storage circuit during pulse generation.

Still another feature of this invention involves additional switching means responsive to operation of the threshold switching circuit for applying heavy positive feedback current to the threshold switching device to produce a precise output wave form while isolating the switching circuit from the trigger circuit and further establishing conditions for immediate reset of the trigger circuit.

BRIEF DESCRIPTION OF THE DRAWINGS

These and other features of the invention may be more clearly understood from the following detailed description and by reference to the drawing in which.

DESCRIPTION OF THE PREFERRED EMBODIMENTS

Figures 1, 2:
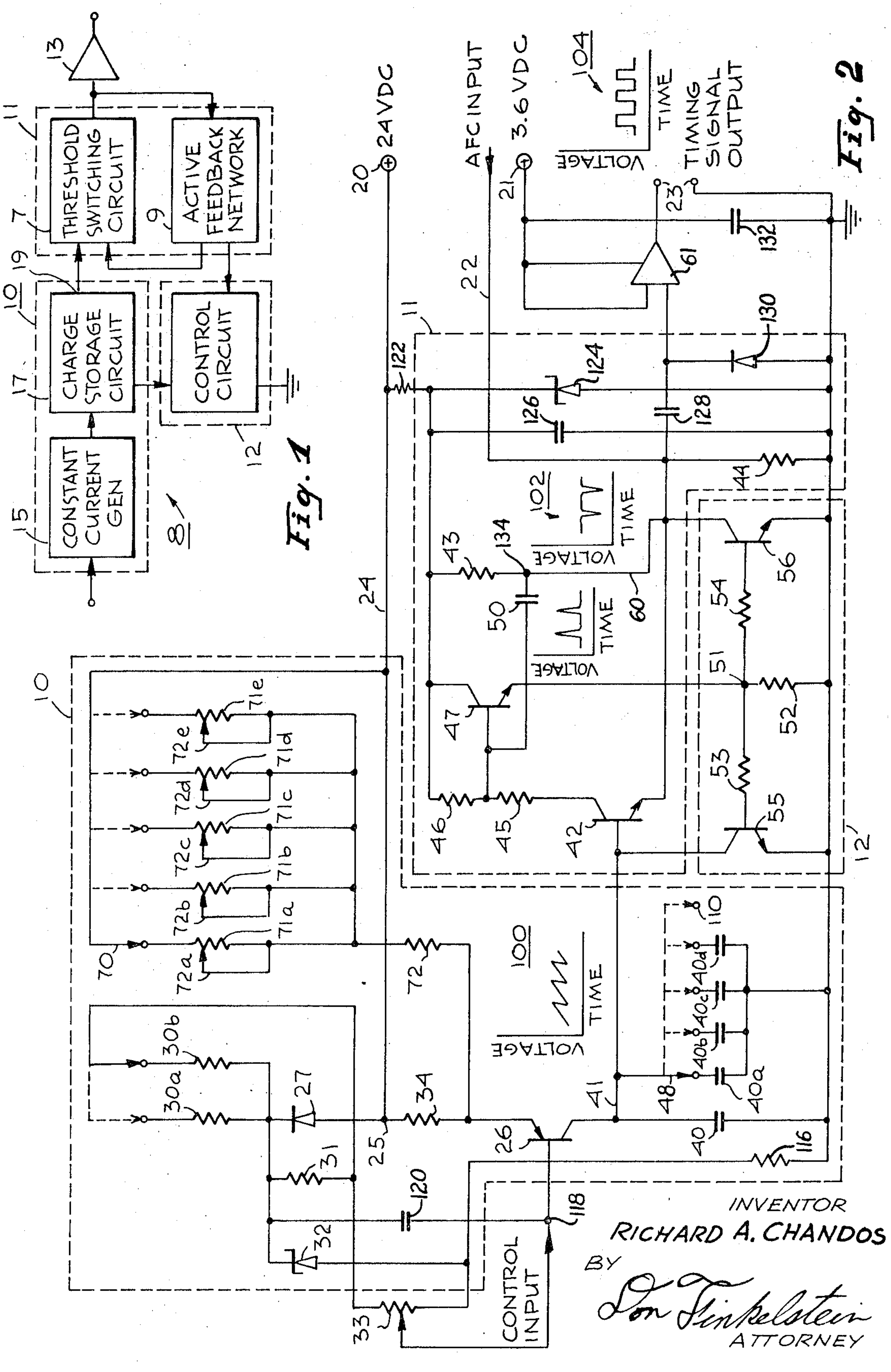
FIG. 1 is a block diagram of the voltage controlled oscillator of this invention.
FIG. 2 is an electrical schematic diagram of a preferred embodiment of this invention.

Now referring to FIG. 1, the voltage controlled oscillator 8, for simplicity, may be considered comprising three basic components, namely, a timing circuit 10 producing a time varying wave form signal having a reproducible characteristic within the accuracy limits required for the voltage controlled oscillator, a switching circuit 11 triggered responsively to a precise point on the wave-form from the timing circuit and a control circuit 12 responsive to operation of the switching circuit 11 to reset the timing circuit 10 and to improve the output waveform of the threshold switching circuit 11. An output amplifier 13 having sufficient wide band characteristics is connected to the output of the threshold switching circuit 11 to provide amplified output pulses having a time relationship varying as a function of electrical control input applied to the timing circuit 10.

The timing circuit 10 is illustrated, in one form as a constant current generator 15 supplying current to a charge storage circuit 17 capable of accepting any level of current delivered by the constant current generator 15 and producing a terminal voltage at the output terminal 19 thereof which is the integral of the current-time function. An example of a suitable charge storage circuit 17 is an ideal capacitor exhibiting a voltage proportional to the current-time integral. The timing circuit output signal at output terminal 19 serves as the switching input signal to the switching circuit 11 having a threshold switching circuit 7 with a precise threshold at which it switches from a first state to a second state and thereupon, in the second state, produces an output pulse which is time related to operation of the timing circuit. As indicated above the high speed switching transistor oscillator is an example of a threshold switching device for the threshold switching circuit 7 of the type which may be used in carrying out this invention.

In order to achieve an output waveform of shorter rise time and higher amplitude, the output signal of the threshold switching circuit 7 to its input. The feedback tive feedback network 9 applying the output pulse of the threshold switching circuit 7 to its input. The feedback network 9 also provides a pair of outputs: one varying the operating characteristic of the threshold switching circuit 7 to improve the wave form of the output pulse therefrom and the second operates through control circuit 12 to discharge the charge storage device of the timing circuit 10 and isolate the switching circuit 11 from the timing circuit 10. These latter two functions are accomplished in order to allow the circuit to be reset and to allow the broad range of frequencies of operation employing the oscillator of this invention. Suffice it to say that the oscillator of this invention includes not only the combination of the timing circuit 10 and the switching circuit 11 but the addition of the features outlined above provides a precise waveform output signal at the output 5 of oscillator 8, and the output signal is controllable over a range in the order of 0.001 Hz. to several megahertz.

Now referring in detail to FIG. 2 wherein there is shown an electrical schematic diagram of the voltage controlled oscillator 8, it can be seen that it is powered from two regulated D.C. supplies 20 and 21 and is designed to furnish a precisely timed signal pulse train on leads 23 to whatever utilization circuit is to be operated under the control of the voltage controlled oscillator 8.

The basic timing circuit 10 is powered by supply voltage from D.C. supply 20 over lead 24 to junction 25. The base-emitter voltage of current generator transistor 26 is derived from junction 25 via a network including precision resistors 34, 72 and 72*a* through 72*e*, inclusive, in the emitter circuit and precision resistors 30*a*, 30*b*, 31 and potentiometer 33 in the base circuit between the junction 25 and the base of transistor 26. The Zener diode 32 maintains a constant voltage across resistors 30*a*, 30*b* and 31 in series with potentiometer 33. Voltage control at the control input junction 118 is achieved for the voltage controlled oscillator 8 by connection of the base of transistor 26 to the arm of potentiometer 33 for comparatively large desired frequency changes. Frequency variation in the output of voltage controlled oscillator 8 is thus achieved by such voltage control since changes in the voltage level at junction 118 change the current flow through transistor 26 which, in turn, changes the charging rate of capacitor 40 (and 40*a*, 40*b*, 40*c* and/or 40*d*, if utilized) thereby changing the pulse frequency. Fine tuning, or small frequency changes, are achieved by the AFC input on lead 22 that varies the voltage at junction 134.

Resistor 116 provides the current to Zener diode 32. Capacitor 120 may be utilized, if desired, for filtering of power supply input ripple, though such a filtering capacitor is often not necessary for successful operation of the invention. In this configuration, the current drawn by the transistor 26 is virtually independent of the collector lead and the transistor 26 acts as a constant current generator. The current is all used to charge capacitor 40 (and additional capacitance furnished by selected tapped capacitors 40*a*, 40*b*, 40*c* and 40*d*). The terminal voltage of capacitor 40 will vary linearly with the passage of time until discharged. This produces a linear voltage characteristic on lead 41 and, if discharged, the voltage on lead 41 becomes a sawtooth or triangular wave. Diode 27 provides temperature compensation for variations in the temperature of the base emitter junction of transistor 26.

As will be seen from the description of the remainder of the circuit, the discharge of capacitor 40 is rapidly effected and the waveform thereupon becomes a time-varying signal or a virtual sawtooth, as so represented in the drawing at 100. The lead 41 applies the time varying voltage to the base of the normally nonconducting switching transistor 42 of the threshold switching circuit 11. The base-emitter potential of transistor 42 is determined by the D.C. supply voltage 20 and a voltage divider comprising resistors 43 and 44. The collector circuit of transistor 42 includes a pair of resistors 45 and 46, the junction of which is connected to the base circuit of a transistor 47 associated with the feedback circuit of transistor 42. As indicated above, transistor 42 is normally in a quiescent state but when the base-emitter potential exceeds the predetermined threshold level, it is switched into conducting condition and commences to draw current from the supply 20 through the resistors 45 and 46. A portion of the current so produced is fed back from the emitter circuit via the capacitor 50 and serves to maintain the switched condition of transistor 42. The collector current drawn during conduction of transistor 42 produces a voltage drop across resistor 46 sufficient to cause transistor 47 to conduct, thereby causing the potential of terminal 51 in control circuit 12 to rise, owing to the voltage divider action between the internal resistance of the transistor 47 and a resistance 52.

The junction 51 is connected through matched resistors 53 and 54 to the base electrodes of NPN transistors 55 and 56. Transistor 56, when in its conducting condition, offers a bypass of resistor 44 to ground and when switched by the rise of potential of point 51 virtually grounds the emitter of transistor 42 causing transistor 47 to conduct heavily and produce an extremely high amplitude spike. At the same time, the same change in potential at terminal 51 causes transistor 55 to change from a nonconducting to a conducting condition thereby virtually short circuiting the input of transistor 42 and grounding of the high side of the capacitor 40. The switching of transistor 55 therefore allows the discharge of the charge on capacitor 40 to ground through an extremely low impedance producing the substantially vertical retrace leg of the sawtooth waveform 100 illustrated in connection with lead 41. Switching of transistor 55 resets the timing circuit 10 and isolates the switching circuit 11 from its trigger circuit whereupon its waveform is virtually independent of the timing circuit 10 output impedance. Grounding of the lead 41 by operation of transistor switch 55 similarly terminates the conduction of transistor 42 and transistor 47 and ceases to conduct.

The timing and switch operation of the switching circuit 11 is independent of the time rate of charge of the capacitor 40 and therefore it is possible to use this same voltage controlled oscillator over a wide range of frequencies by changes in the timing circuit 10 alone. Similarly, the accuracy of timing is a function of the timing circuit alone.

The output of the emitter of transistor 42 is not only fed back and used to control the switching of transistor 47, but it constitutes the output pulse of the devices as illustrated at 102 on lead 60 prior to its filtering, amplification and squaring as shown at 104 in an output amplifier 61. The amplifier 61 may be a standard wide band design capable of operating over the frequency range of the voltage controlled oscillator 8 in producing the output pulse of magnitude required. An example of the suitable ouput amplifier is Model L900 Logic Element produced by the Fairchild Camera and Instrument Company of Mountainview, Calif. Capacitor 132 is a decoupling capacitor in the power supply and diode 130 prevents a negative input signal from destroying amplifier 61.

Zener diode 124 provides the precision voltage reference level at the junction 134 which, as shown above, is the voltage level controlling the switching. Resistor 122 provides the current to Zener diode 124.

As indicated above, the circuit of this invention is capable of operating over an extremely broad range of frequencies and these frequencies are obtained without change of the switching circuitry, only by changes in the timing circuit 10.

In addition to the selection of resistors 30*a* and 30*b* in the basic timing circuit 10 between the supply junction 25 and the base, an adjustment of the value of the emitter resistor 34 can also produce a range adjustment. This is accomplished by appropriate connection of a selector switch 70 in the bank of adjustable resistors 71*a*, 71*b*, 71*c*, 71*d* and 71*e*, whereby additional resistance is connected in parallel with the emitter resistor 34. Thus, by the selection of the appropriate tap with switch 70 and the adjustment of each of the resistors 71*a*, 71*b*, 71*c*, 71*d* and 71*e*, by its associated potentiometer arm 72*a*, 72*b*, 72*c*, 72*d* and 72*e* can provide frequency range variations. Further adjustment of the frequency range may be accomplished by the switching of additional capacitance into the storage capacitance 40. This is represented by the bank of capacitors 40*a*, 40*b*, 40*c* and 40*d* connected in parallel to ground with the capacitor 40. With an increase in capacitance, the time rate of increase, or slope, of the sawtooth wave 100 is decreased. Adjustment of this additional capacitance is made by arm or selector switch 48 which is movable to the four positions associated with each of the capacitors 40*a*, 40*b*, 40*c* and 40*d* and to a fifth position 110 whereupon the capacitor bank 40*a*, 40*b*, 40*c* and 40*d* is out of the circuit and the capacitor 40 alone determines the time rate of change of the timing circuit.

Typical components used in one embodiment of this invention are cataloged below:

| | Type |
|---|---|
| Transistors— | |
| 26 | 2N4917. |
| 42 | GME4003. |
| 47 | 2N4037. |
| 55 | 2N4418. |
| 56 | 2N4418. |
| Diodes— | |
| 32 | 1N759A. |
| 27 | 1N2069. |
| Capacitors— | |
| 40 | 100 pf. 56A–T10 (Sprague). |
| 50 | 470 pf. 56A–T47 (Sprague). |
| Resistors— | |
| 34 | 470 ohms. |
| 31 | 800 ohms ±1%. |
| 45 | 1K ohms. |
| 46 | 1K ohms. |
| 43 | 800 ohms ±1%. |
| 44 | 200 ohms ±1%. |
| 52 | 150K. |
| 53 | 150K. |
| 54 | 150K. |
| 72 | 1K. |

From the foregoing, it may be seen that I have invented an improved voltage controlled oscillator of broadly selectable frequency range, precise accuracy and yet simple design. It employs a high speed switching transistor oscillator with improvements in the timing circuit as well as in the threshold switching circuit. In the specific embodiment shown, only a single transistor is used in the timing circuit along with a precision resistance network forming a constant current generator. The current generator cooperates with a charge integrating capacitor to provide the required time varying voltage.

The threshold switching circuit includes basically a single transistor switch with active feedback and additional feedback circuit controlled switches. It must be recognized that in its present form, the circuit is optimized in design for use as a timing signal generator for digital filter use. However, one skilled in the art, with different requirements in mind, is capable of varying the specific circuit design without departing from the concept and spirit of this invention as defined by the appended claims.

I claim:

1. A frequency generator comprising:

a switching device having an input and an output and subject to switching from a first condition to a second condition upon subjection to a predetermined voltage applied to said input and having a preselected condition characteristic;

a timing circuit having a predetermined relationship between the integral of current applied thereto and the terminal voltage, and comprising:

a source of constant current;

a charge storage means connected between said source of constant current and said input of said switching device for providing an output voltage to said switching device; and disabling means responsive to the operation of said switching device in said second condition for disabling the input thereto, whereby said switching device is temporarily isolated from said charge storage means and said switching device produces a switching signal unaffected by input load of said charge storage means; and feedback means responsive to the condition of said switching device and coupled thereto for receiving the output signal from said switching device and applying a positive feedback current to the input of the switching device for control of output waveform.

2. The combination in accordance with claim 1 wherein:

said disabling means is operative to discharge said charge storage means, whereby said charge storage means is reset for cyclic operation.

3. The combination in accordance with claim 2 wherein:

said disabling means is operative to modify said conduction characteristics of said switching device to decrease the transient switching time.

4. The combination in accordance with claim 1 wherein:

said timing circuit comprises a first transistor, having a base, an emitter and a collector terminal, a resistance network in the base-emitter circuit of said first transistor for establishing a constant base-emitter resistance, whereby said first transistor provides a constant current at said collector terminal upon the application of a constant voltage to the base-emitter circuit.

5. The combination in accordance with claim 4 wherein:

said charge storage means comprises a capacitor in the collector circuit of said transistor for integrating the collector current.

6. The combination in accordance with claim 5 wherein:

said switching device comprises:

a second transistor, having a base, emitter and collector terminals;

voltage divider means having an emitter resistor, for establishing a predetermined cutoff base-emitter voltage upon the application of a constant voltage thereto, and means applying said charge storage means output voltage to said base of said second transistor, whereby said second transistor is switched from cutoff to conducting condition for the output voltage of said charge storage device greater than a predetermined threshold voltage.

7. The combination in accordance with claim 6 and further comprising:

conduction responsive means responsive to the conduction of said second transistor for bypassing at least part of said voltage divider means to increase the conduction of said second transistor.

8. The combination in accordance with claim 7 wherein:

said conduction responsive means comprises a transistor circuit means biased to cutoff by the collector circuit of said second transistor and responsive to current flow in the collector circuit of said second transistor to bypass the emitter resistor of the voltage divider means.

9. The combination in accordance with claim 8 wherein:

said transistor circuit means is operative upon conduction for grounding said base of said second transistor to discharge said capacitor of said timing circuit.

10. A threshold switching circuit comprising:

a first transistor having base, emitter and collector terminals, and base, emitter and collector circuits associated therewith, respectively, means including a resistance network for applying a constant voltage to said collector and emitter circuits of said first transistor to establish a fixed threshold signal level for conduction thereof;

input means for applying a variable voltage to said base terminal of said first transistor whereby, said first transistor switches from a nonconducting condition to a conducting condition for a predetermined base voltage;

means including a second transistor having base, emitter and collector terminals responsive to said resistance network;

said second transistor having said base terminal connected to said collector circuit of said first transistor whereby the passage of collector current in said first transistor is operative to switch said second transistor to a conducting condition; and second transistor operative upon conduction to short circuit said base terminal of said transistor.

11. The combination in accordance with claim 10 wherein:

a third transistor;

said second transistor and said third transistor is operative upon conduction to bypass a portion of said resistance network, whereby said emitter terminal of said first transistor is effectively grounded and the conduction of said first transistor is increased.

References Cited

UNITED STATES PATENTS

| | | | |
|---|---|---|---|
| 3,156,875 | 11/1964 | Fiorino et al. | 331—111 |
| 3,376,518 | 4/1968 | Emmer | 331—111 |

ROY LAKE, Primary Examiner

S. H. GRIMM, Assistant Examiner

U.S. Cl. X.R.

307—246, 254; 331—143, 177